United States Patent
Thakur et al.

(10) Patent No.: US 7,175,713 B2
(45) Date of Patent: *Feb. 13, 2007

(54) APPARATUS FOR CYCLICAL DEPOSITION OF THIN FILMS

(75) Inventors: Randhir P. S. Thakur, San Jose, CA (US); Alfred W. Mak, Union City, CA (US); Ming Xi, Palo Alto, CA (US); Walter Benjamin Glenn, Pacifica, CA (US); Ahmad A. Khan, Milpitas, CA (US); Ayad A. Al-Shaikh, Santa Clara, CA (US); Avgerinos V. Gelatos, Redwood City, CA (US); Salvador P. Umotoy, Antioch, CA (US)

(73) Assignee: Applied Materials, Inc., Santa Clara, CA (US)

( * ) Notice: Subject to any disclaimer, the term of this patent is extended or adjusted under 35 U.S.C. 154(b) by 262 days.

This patent is subject to a terminal disclaimer.

(21) Appl. No.: 10/352,257

(22) Filed: Jan. 27, 2003

(65) Prior Publication Data

US 2003/0172872 A1 Sep. 18, 2003

Related U.S. Application Data

(60) Provisional application No. 60/351,561, filed on Jan. 25, 2002.

(51) Int. Cl.
*C23C 16/00* (2006.01)
*C23C 16/503* (2006.01)
*C23C 16/505* (2006.01)
*C23C 16/50* (2006.01)
*C23F 1/00* (2006.01)
*H01L 21/306* (2006.01)

(52) U.S. Cl. ............... 118/715; 156/345.29; 118/723 R (58) Field of Classification Search ................ 118/715, 118/728, 50, 723 R; 156/345.29, 345.33, 156/345.34
See application file for complete search history.

(56) References Cited

U.S. PATENT DOCUMENTS 3,854,443 A 12/1974 Baerg ........................ 118/49
4,058,430 A 11/1977 Suntola et al. .............. 156/611

(Continued)

FOREIGN PATENT DOCUMENTS

EP 0 497 267 8/1992

(Continued)

OTHER PUBLICATIONS

Chang-Wook, et al., "Growth and Characterization of Aluminum Oxide ($Al_2O_3$) Thin Films by Plasma-Assisted Atomic Layer Controlled Deposition," J. Korean Inst. Met. Mater., vol. 38, No. 10, Oct. 2000 pp. 1395-1399.

(Continued)

*Primary Examiner*—Rudy Zervigon
(74) *Attorney, Agent, or Firm*—Patterson & Sheridan, LLP (57) ABSTRACT

An apparatus for cyclical depositing of thin films on semiconductor substrates, comprising a process chamber having a gas distribution system with separate paths for process gases and an exhaust system synchronized with operation of valves dosing the process gases into a reaction region of the chamber.

11 Claims, 9 Drawing Sheets

U.S. PATENT DOCUMENTS

| | | | |
|---|---|---|---|
| 4,389,973 A | 6/1983 | Suntola et al. | 118/725 |
| 4,413,022 A | 11/1983 | Suntola et al. | 427/255.2 |
| 4,415,275 A | 11/1983 | Dietrich | |
| 4,486,487 A | 12/1984 | Skarp | 428/216 |
| 4,761,269 A * | 8/1988 | Conger et al. | 118/679 |
| 4,834,831 A | 5/1989 | Nishizawa et al. | 156/611 |
| 4,975,252 A | 12/1990 | Nishizawa et al. | 118/688 |
| 4,993,357 A | 2/1991 | Scholz | 118/715 |
| 5,027,746 A | 7/1991 | Frijlink | |
| 5,173,327 A | 12/1992 | Sandhu et al. | |
| 5,225,366 A | 7/1993 | Yoder | 437/108 |
| 5,261,959 A | 11/1993 | Gasworth | 118/719 |
| 5,281,274 A * | 1/1994 | Yoder | 118/697 |
| 5,294,286 A | 3/1994 | Nishizawa et al. | 156/610 |
| 5,306,666 A | 4/1994 | Izumi | 437/192 |
| 5,338,362 A | 8/1994 | Imahashi | 118/719 |
| 5,374,570 A | 12/1994 | Nasu et al. | 437/40 |
| 5,441,703 A | 8/1995 | Jurgensen | 422/129 |
| 5,443,647 A | 8/1995 | Aucoin et al. | 118/723 ME |
| 5,480,818 A | 1/1996 | Matsumoto et al. | 437/101 |
| 5,483,919 A | 1/1996 | Yokoyama et al. | 117/89 |
| 5,503,875 A | 4/1996 | Imai et al. | 427/255.3 |
| 5,674,786 A | 10/1997 | Turner et al. | 437/225 |
| 5,711,811 A | 1/1998 | Suntola et al. | 118/711 |
| 5,730,802 A | 3/1998 | Ishizumi et al. | 118/719 |
| 5,796,116 A | 8/1998 | Nakata et al. | 257/66 |
| 5,807,792 A | 9/1998 | Ilg et al. | 438/758 |
| 5,835,677 A | 11/1998 | Li et al. | 392/401 |
| 5,851,294 A * | 12/1998 | Young et al. | 118/715 |
| 5,855,680 A | 1/1999 | Soininen et al. | 118/719 |
| 5,879,459 A | 3/1999 | Gadgil et al. | 118/715 |
| 5,916,365 A | 6/1999 | Sherman | 117/92 |
| 5,923,056 A | 7/1999 | Lee et al. | 257/192 |
| 5,972,430 A | 10/1999 | DiMeo, Jr. et al. | |
| 5,976,261 A | 11/1999 | Moslehi et al. | 118/719 |
| 6,001,267 A * | 12/1999 | Os et al. | 216/67 |
| 6,015,590 A | 1/2000 | Suntola et al. | 427/255.23 |
| 6,042,652 A | 3/2000 | Hyun et al. | 118/719 |
| 6,043,177 A | 3/2000 | Falconer et al. | 502/4 |
| 6,071,572 A | 6/2000 | Mosely et al. | |
| 6,124,158 A | 9/2000 | Dautartas et al. | 438/216 |
| 6,139,700 A | 10/2000 | Kang et al. | 204/192.17 |
| 6,143,659 A | 11/2000 | Leem | 438/688 |
| 6,144,060 A | 11/2000 | Park et al. | 257/310 |
| 6,174,377 B1 | 1/2001 | Doering et al. | 118/729 |
| 6,174,809 B1 | 1/2001 | Kang et al. | 438/682 |
| 6,176,198 B1 | 1/2001 | Kao et al. | 118/723 ME |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,302 B1 | 3/2001 | Sugiura et al. | 428/690 |
| 6,207,487 B1 | 3/2001 | Kim et al. | 438/238 |
| 6,231,672 B1 | 5/2001 | Choi et al. | 118/715 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 10/2001 | Sneh et al. | 118/723 R |
| 6,306,216 B1 | 10/2001 | Kim et al. | 118/725 |
| 6,335,240 B1 | 1/2002 | Kim et al. | 438/253 |
| 6,342,277 B1 | 1/2002 | Sherman | 427/562 |
| 6,358,829 B2 | 3/2002 | Yoon et al. | 438/597 |
| 6,399,491 B2 | 6/2002 | Jeon et al. | 438/680 |
| 6,416,577 B1 | 7/2002 | Suntoloa et al. | 117/88 |
| 6,446,572 B1* | 9/2002 | Brcka | 118/723 ER |
| 6,447,607 B2 | 9/2002 | Soininen et al. | 117/200 |
| 6,451,119 B2 | 9/2002 | Sneh et al. | 118/715 |
| 6,468,601 B1* | 10/2002 | Shang et al. | 427/563 |
| 6,468,924 B2 | 10/2002 | Lee et al. | 438/763 |
| 6,478,872 B1 | 11/2002 | Chae et al. | 117/88 |
| 6,481,945 B1 | 11/2002 | Hasper et al. | 414/217 |
| 6,489,214 B2 | 12/2002 | Kim et al. | 438/396 |
| 6,511,539 B1 | 1/2003 | Raaijmakers | 17/102 |
| 6,534,395 B2 | 3/2003 | Werkhoven et al. | 438/627 |
| 6,551,406 B2 | 4/2003 | Kilpi | 118/728 |
| 6,572,705 B1 | 6/2003 | Suntola et al. | 118/702 |
| 6,578,287 B2 | 6/2003 | Aswald | 34/367 |
| 6,579,372 B2 | 6/2003 | Park | 118/715 |
| 6,593,484 B2 | 7/2003 | Yasuhara et al. | |
| 6,620,670 B2 | 9/2003 | Song et al. | 438/216 |
| 6,630,030 B1 | 10/2003 | Suntola et al. | 118/728 |
| 6,630,201 B2 | 10/2003 | Chiang et al. | 427/255.28 |
| 6,632,279 B1 | 10/2003 | Ritala et al. | 117/101 |
| 6,660,126 B2 | 12/2003 | Nguyen et al. | 156/345.34 |
| 6,660,660 B2 | 12/2003 | Haukka et al. | 438/778 |
| 6,716,287 B1 | 4/2004 | Santiago et al. | |
| 6,718,126 B2 | 4/2004 | Lei | |
| 6,734,020 B2 | 5/2004 | Lu et al. | |
| 6,772,072 B2 | 8/2004 | Ganguli et al. | |
| 6,773,507 B2 | 8/2004 | Jallepally et al. | |
| 6,777,352 B2 | 8/2004 | Tepman et al. | |
| 6,778,762 B1 | 8/2004 | Shareef et al. | |
| 6,815,285 B2 | 11/2004 | Choi et al. | |
| 6,818,094 B2 | 11/2004 | Yudovsky | |
| 6,821,563 B2 | 11/2004 | Yudovsky | |
| 6,866,746 B2 | 3/2005 | Lei et al. | |
| 6,868,859 B2 | 3/2005 | Yudovsky | |
| 2001/0000866 A1 | 5/2001 | Sneh et al. | 118/723 IR |
| 2001/0009140 A1 | 7/2001 | Bondestam et al. | 118/725 |
| 2001/0011526 A1 | 8/2001 | Doering et al. | 118/729 |
| 2001/0013312 A1 | 8/2001 | Soininen et al. | 17/86 |
| 2001/0014371 A1 | 8/2001 | Kilpi | 427/255.28 |
| 2001/0024387 A1 | 9/2001 | Raaijmakers et al. | 365/200 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0050039 A1 | 12/2001 | Park | 117/102 |
| 2001/0054377 A1 | 12/2001 | Lindfors et al. | 117/104 |
| 2001/0054730 A1 | 12/2001 | Kim et al. | 257/301 |
| 2002/0000196 A1 | 1/2002 | Park | 118/715 |
| 2002/0000598 A1 | 1/2002 | Kang et al. | 257/301 |
| 2002/0007790 A1 | 1/2002 | Park | 118/715 |
| 2002/0009544 A1 | 1/2002 | McFeely et al. | |
| 2002/0009896 A1 | 1/2002 | Sandhu et al. | |
| 2002/0017242 A1 | 2/2002 | Hamaguchi et al. | |
| 2002/0021544 A1 | 2/2002 | Cho et al. | 361/200 |
| 2002/0031618 A1 | 3/2002 | Sherman | 427/569 |
| 2002/0041931 A1 | 4/2002 | Suntola et al. | 427/255.28 |
| 2002/0048635 A1 | 4/2002 | Kim et al. | 427/331 |
| 2002/0052097 A1 | 5/2002 | Park | |
| 2002/0060363 A1 | 5/2002 | Xi et al. | 257/751 |
| 2002/0066411 A1 | 6/2002 | Chiang et al. | 118/724 |
| 2002/0073924 A1 | 6/2002 | Chiang et al. | 118/723 R |
| 2002/0074588 A1 | 6/2002 | Lee | 257/306 |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0081844 A1 | 6/2002 | Jeon et al. | 438/680 |
| 2002/0086106 A1 | 7/2002 | Park et al. | 427/248.1 |
| 2002/0086507 A1 | 7/2002 | Park et al. | 438/585 |
| 2002/0092471 A1 | 7/2002 | Kang et al. | 118/715 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 I |
| 2002/0106451 A1 | 8/2002 | Skarp et al. | 427/248.1 |
| 2002/0106536 A1 | 8/2002 | Lee et al. | 428/702 |
| 2002/0108570 A1 | 8/2002 | Lindfors | 118/715 |
| 2002/0110991 A1 | 8/2002 | Li | |
| 2002/0115252 A1 | 8/2002 | Haukka et al. | 438/240 |
| 2002/0115886 A1 | 8/2002 | Yasuhara et al. | |
| 2002/0117399 A1 | 8/2002 | Chen et al. | 205/125 |

| | | | | | | |
|---|---|---|---|---|---|---|
| 2002/0121241 A1 | 9/2002 | Nguyen et al. ............ 118/715 | 2004/0033698 A1 | 2/2004 | Lee et al. .................. 438/758 |
| 2002/0121342 A1 | 9/2002 | Nguyen et al. ........ 156/345.33 | 2004/0043630 A1 | 3/2004 | Vaarstra et al. ............. 438/778 |
| 2002/0127745 A1 | 9/2002 | Lu et al. ...................... 438/14 | 2004/0046197 A1 | 3/2004 | Basceri et al. ............. 257/296 |
| 2002/0134307 A1 | 9/2002 | Choi ............................ 118/715 | 2004/0048491 A1 | 3/2004 | Jung et al. ................. 438/785 |
| 2002/0144655 A1 | 10/2002 | Chiang et al. .............. 118/715 | 2004/0051152 A1 | 3/2004 | Nakajima ................... 257/411 |
| 2002/0144657 A1 | 10/2002 | Chiang et al. ........... 118/723 E | 2004/0053484 A1 | 3/2004 | Kumar et al. ............... 438/585 |
| 2002/0146511 A1 | 10/2002 | Chiang et al. ............ 427/248.1 | 2004/0065255 A1 | 4/2004 | Yang et al. |
| 2002/0173130 A1 | 11/2002 | Pomerede et al. .......... 438/592 | 2004/0069227 A1 | 4/2004 | Ku et al. |
| 2002/0177282 A1 | 11/2002 | Song ........................ 438/300 | 2004/0071897 A1 | 4/2004 | Verplancken et al. |
| 2002/0187631 A1 | 12/2002 | Kim et al. ................... 438/637 | 2004/0144308 A1 | 7/2004 | Yudovsky |
| 2002/0196591 A1 | 12/2002 | Hujanen et al. ............. 360/326 | 2004/0144311 A1 | 7/2004 | Chen et al. |
| 2002/0197881 A1 | 12/2002 | Ramdani et al. ............ 438/764 | 2004/0219784 A1 | 11/2004 | Kang et al. |
| 2003/0004723 A1 | 1/2003 | Chihara | 2004/0224506 A1 | 11/2004 | Choi et al. |
| 2003/0010451 A1 | 1/2003 | Tzu et al. .............. 156/345.33 | 2004/0235285 A1 | 11/2004 | Kang et al. |
| 2003/0013320 A1 | 1/2003 | Kim et al. .................. 438/778 | 2005/0006799 A1 | 1/2005 | Gregg et al. |
| 2003/0015764 A1 | 1/2003 | Raaijmakers et al. ....... 257/424 | 2005/0059240 A1 | 3/2005 | Choi et al. |
| 2003/0017697 A1 | 1/2003 | Choi et al. | 2005/0095859 A1 | 5/2005 | Chen et al. |
| 2003/0023338 A1 | 1/2003 | Chin et al. ................... 700/121 | 2005/0104142 A1 | 5/2005 | Narayanan et al. |
| 2003/0032281 A1 | 2/2003 | Werkhoven et al. ........ 438/640 | | | |
| 2003/0042630 A1 | 3/2003 | Babcoke et al. ......... 261/121.1 | | FOREIGN PATENT DOCUMENTS | |
| 2003/0049942 A1 | 3/2003 | Haukka et al. ............. 438/778 | EP | 1 167 569 A1 | 1/2002 |
| 2003/0053799 A1 | 3/2003 | Lei ............................. 392/388 | GB | 2 355 727 | 5/2001 |
| 2003/0057527 A1 | 3/2003 | Chung et al. | JP | 58-097917 | 6/1983 |
| 2003/0072913 A1 | 4/2003 | Chou et al. ................... 428/114 | JP | 10-82671 | 3/1989 |
| 2003/0072975 A1 | 4/2003 | Shero et al. ................. 428/704 | JP | 2-104513 | 1/1990 |
| 2003/0075273 A1 | 4/2003 | Kilpela et al. ........... 156/345.33 | JP | 2-230690 | 9/1990 |
| 2003/0075925 A1 | 4/2003 | Lindfors et al. ............. 285/367 | JP | 2-246161 | 9/1990 |
| 2003/0079686 A1 | 5/2003 | Chen et al. ................. 118/715 | JP | 3-234025 | 10/1991 |
| 2003/0079696 A1 | 5/2003 | Chen et al. ................. 118/715 | JP | 4-291916 | 9/1992 |
| 2003/0089308 A1 | 5/2003 | Raaijmakers et al. ....... 117/200 | JP | 5-029228 | 2/1993 |
| 2003/0089942 A1 | 5/2003 | Bhattacharyya ............. 257/310 | JP | 5-047666 | 2/1993 |
| 2003/0101927 A1 | 6/2003 | Raaijmakers et al. ....... 117/200 | JP | 5-074724 | 3/1993 |
| 2003/0101938 A1 | 6/2003 | Ronsse et al. | JP | 5-206036 | 8/1993 |
| 2003/0106490 A1 | 6/2003 | Jallepally et al. ............. 117/89 | JP | 5-234899 | 9/1993 |
| 2003/0113187 A1 | 6/2003 | Lei et al. .................... 414/217 | JP | 5-270997 | 10/1993 |
| 2003/0116087 A1 | 6/2003 | Nguyen et al. .............. 118/715 | JP | 6-224138 | 5/1994 |
| 2003/0116804 A1 | 6/2003 | Visokay et al. ............. 257/350 | JP | 6-177381 | 6/1994 |
| 2003/0121469 A1 | 7/2003 | Lindfors et al. ............. 117/105 | JP | 6-230421 | 8/1994 |
| 2003/0121608 A1 | 7/2003 | Chen et al. ............ 156/345.33 | JP | 7-086269 | 3/1995 |
| 2003/0129826 A1 | 7/2003 | Werkhoven et al. ........ 438/627 | JP | 11-269652 | 10/1999 |
| 2003/0140854 A1 | 7/2003 | Kilpi ........................... 118/715 | JP | 2000-031387 | 1/2000 |
| 2003/0143328 A1 | 7/2003 | Chen et al. ............. 427/255.28 | JP | 2000-058777 | 2/2000 |
| 2003/0143747 A1 | 7/2003 | Bondestam et al. .......... 436/34 | JP | 2000-319772 | 3/2000 |
| 2003/0153177 A1 | 8/2003 | Tepman et al. .............. 438/656 | JP | 2000-212752 | 8/2000 |
| 2003/0160277 A1 | 8/2003 | Bhattachyrra ............... 257/310 | JP | 2001-020072 | 11/2000 |
| 2003/0165615 A1 | 9/2003 | Aaltonen et al. .............. 427/79 | JP | 2001-020075 | 11/2000 |
| 2003/0168750 A1 | 9/2003 | Basceri et al. ............... 257/532 | JP | 10-308283 | 3/2001 |
| 2003/0172872 A1 | 9/2003 | Thakur ....................... 118/715 | JP | 2001-111000 | 4/2001 |
| 2003/0173586 A1 | 9/2003 | Moriwaki et al. ........... 257/200 | JP | 2001/172767 | 6/2001 |
| 2003/0185980 A1 | 10/2003 | Endo ..................... 427/255.23 | JP | 2001-220294 | 8/2001 |
| 2003/0194493 A1 | 10/2003 | Chang et al. ............ 427/248.1 | JP | 2001-328900 | 11/2001 |
| 2003/0198754 A1 | 10/2003 | Xi et al. ...................... 427/576 | WO | 96/17107 | 6/1996 |
| 2003/0205729 A1 | 11/2003 | Basceri et al. ............... 257/200 | WO | 98/23788 | 6/1998 |
| 2003/0213560 A1 | 11/2003 | Wang et al. ............ 156/745.51 | WO | 99/01595 | 1/1999 |
| 2003/0213987 A1 | 11/2003 | Basceri et al. ............... 257/296 | WO | 99/29924 | 6/1999 |
| 2003/0216981 A1 | 11/2003 | Tillman ........................ 705/34 | WO | 99/65064 | 12/1999 |
| 2003/0219942 A1 | 11/2003 | Choi et al. | WO | 00/54320 | 9/2000 |
| 2003/0221780 A1 | 12/2003 | Lei et al. ............... 156/345.29 | WO | 00/79576 | 12/2000 |
| 2003/0224107 A1 | 12/2003 | Lindfors et al. ........ 427/255.28 | WO | 01/17692 | 3/2001 |
| 2003/0227033 A1 | 12/2003 | Ahn et al. .................. 257/213 | WO | 01/36702 | 5/2001 |
| 2003/0232554 A1 | 12/2003 | Blum et al. ................... 442/76 | WO | 01/66832 | 9/2001 |
| 2003/0235961 A1 | 12/2003 | Metzner et al. ............. 438/287 | WO | 02/08488 | 1/2002 |
| 2004/0005749 A1 | 1/2004 | Choi et al. | WO | 02/31875 | 4/2002 |
| 2004/0009307 A1 | 1/2004 | Koh et al. ................... 427/569 | WO | 02/43115 | 5/2002 |
| 2004/0011464 A1 | 1/2004 | Ku et al. ..................... 137/341 | WO | 02/45167 | 6/2002 |
| 2004/0011504 A1 | 1/2004 | Ku et al. ....................... 165/47 | WO | 02/45871 | 6/2002 |
| 2004/0013577 A1 | 1/2004 | Ganguli et al. ............. 422/129 | WO | 02/065525 | 8/2002 |
| 2004/0014320 A1 | 1/2004 | Chen et al. ................. 438/692 | WO | 02/067319 | 8/2002 |
| 2004/0015300 A1 | 1/2004 | Ganguli et al. ............. 702/24 | | | |
| 2004/0016404 A1 | 1/2004 | Gregg et al. | | | |
| 2004/0018747 A1 | 1/2004 | Lee et al. .................... 438/761 | | | |
| 2004/0025370 A1 | 2/2004 | Guenther et al. | | | |
| 2004/0028952 A1 | 2/2004 | Cartler et al. ............... 428/698 | | | |

| | | | |
|---|---|---|---|
| WO | WO 03/23835 A1 | 3/2003 | |

OTHER PUBLICATIONS

European Search Report dated Sep. 23, 2005 from European Application No. 03257169.7.

Kim, et al. "Substrate dependence on the optical properties of $Al_2O_3$ films grown by atomic layer deposition," Appl. Phys. Lett. 71 (25), Dec. 22, 1997.

George, et al. "Atomic Layer Controlled Deposition of $SiO_2$ and $Al_2O_3$ using ABAB . . . binary reaction sequence chemistry," Applied Surface Science 82/83 (1994) 460-467.

George, et al. "Surface Chemistry for Atomic Layer Growth," J. Phys. Chem. 1996 100, 13121-13131.

Niinisto, et al. "Synthesis of Oxide Thin Films and Overlayers by Atomic Layer Epitaxy for Advanced Applications," Materials Science and Engineering B41 (1996) 23-29.

Ritala, et al. "Perfectly Conformal TiN and $Al_2O_3$ Films Deposited by Atomic Layer Deposition," Chem. Vap. Deposition 1999, 5, No. 1.

Paranjpe, et al. "Atomic Layer Deposition of $AlO_3$ for Thin Film Head Gap Applications," J. Elec. Soc., vol. 148, No. 9 Sep. 2001 pp. G465-471.

Chang-Wook, et al. "Plasma-assisted Atomic Layer Growth of High-Quality Aluminum Oxide Thin Films," Jpn. J. Appl. Phys. 1, vol. 40, No. 1, Jan. 2001 pp. 285-289.

Ritala, et al. "Atomic Layer Deposition of Oxide Thin Films with Metal Alkoxides as Oxygen Sources," Science vol. 288 Apr. 14, 2000.

Hwang, et al. "Nanometer-Size $\alpha$-$PbO_2$-type $TiO_2$ in Garnet: A Thermobarometer for Ultrahigh-Pressure Metamorphism," Science Vo. 288 (Apr. 14, 2000).

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

* cited by examiner

APPARATUS FOR CYCLICAL DEPOSITION OF THIN FILMS

CROSS-REFERENCE TO RELATED APPLICATIONS

This application claims benefit of U.S. provisional patent application Ser. No. 60/351,561, filed Jan. 25, 2002, which is herein incorporated by reference.

BACKGROUND OF THE INVENTION

1. Field of the Invention

The present invention generally relates to semiconductor processing. More particularly, the invention relates to an apparatus for performing cyclical deposition processes in semiconductor substrate processing systems.

2. Description of the Related Art

An atomic layer deposition (ALD) process is a cyclical deposition method that is generally used for depositing ultra-thin layers (e.g., mono-layers) over features of semiconductor devices having a high aspect ratio, i.e., a ratio of the depth of a feature to the smallest width of the feature.

The ALD process utilizes a chemisorption phenomenon to deposit mono-layers of reactive precursor molecules. During the ALD process, reactive precursors are injected, in the form of pulsed gases, into a deposition chamber in a predetermined cyclical order. Each injection of a precursor provides a new atomic layer on a substrate that is additive to or combines with the previously deposited layers. Injections of individual precursor gases generally are separated by injections of a purge gas or, in other embodiments, the purge gas may be flown continuously into the deposition chamber. The purge gas generally comprises an inert gas, such as argon (Ar), helium (He), and the like or a mixture thereof. During the ALD process, the deposition chamber is also continuously evacuated to reduce the gas phase reactions between the precursors.

There are many challenges associated with ALD technique that affect the film properties and costs of operation and ownership. For example, unwanted gas phase reactions between precursors within the process chamber of the prior art may cause contamination of deposited films and require frequent cleaning of the chamber, thus decreasing productivity of the ALD process.

Therefore, there is a need for an improved apparatus for performing cyclical deposition of thin films during fabrication of semiconductor devices.

SUMMARY OF THE INVENTION

The present invention is an apparatus for performing cyclical deposition of thin films on semiconductor substrates with low film contamination and minimal gas phase reactions between the precursors. The apparatus comprises a process chamber having a gas distribution system facilitating separate paths for process gases and an exhaust system that is synchronized with the valves dosing the process gases. Various embodiments of the apparatus are described. In one application, the invention is used to deposit an aluminum oxide ($Al_2O_3$) film.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION OF THE INVENTION

The present invention is an apparatus for performing cyclical deposition of thin films on semiconductor substrates (e.g., using an atomic layer deposition (ALD) process and the like) with low film contamination and minimal gas phase reactions between the reactive precursors. In one application, the apparatus is used to deposit an aluminum oxide ($Al_2O_3$) film. In other applications, the apparatus may be used to deposit other films that include materials such as aluminum (Al), copper (Cu), titanium (Ti), tantalum (Ta), tungsten (W) films, hafnium (Hf), various magnetic materials and the like.

FIGS. 1–9 are schematic views of various embodiments of an exemplary processing system 100 and salient portions of the system in accordance with the present invention. The images in FIGS. 1–9 are simplified for illustrative purposes and are not depicted to scale.

Figure 1:
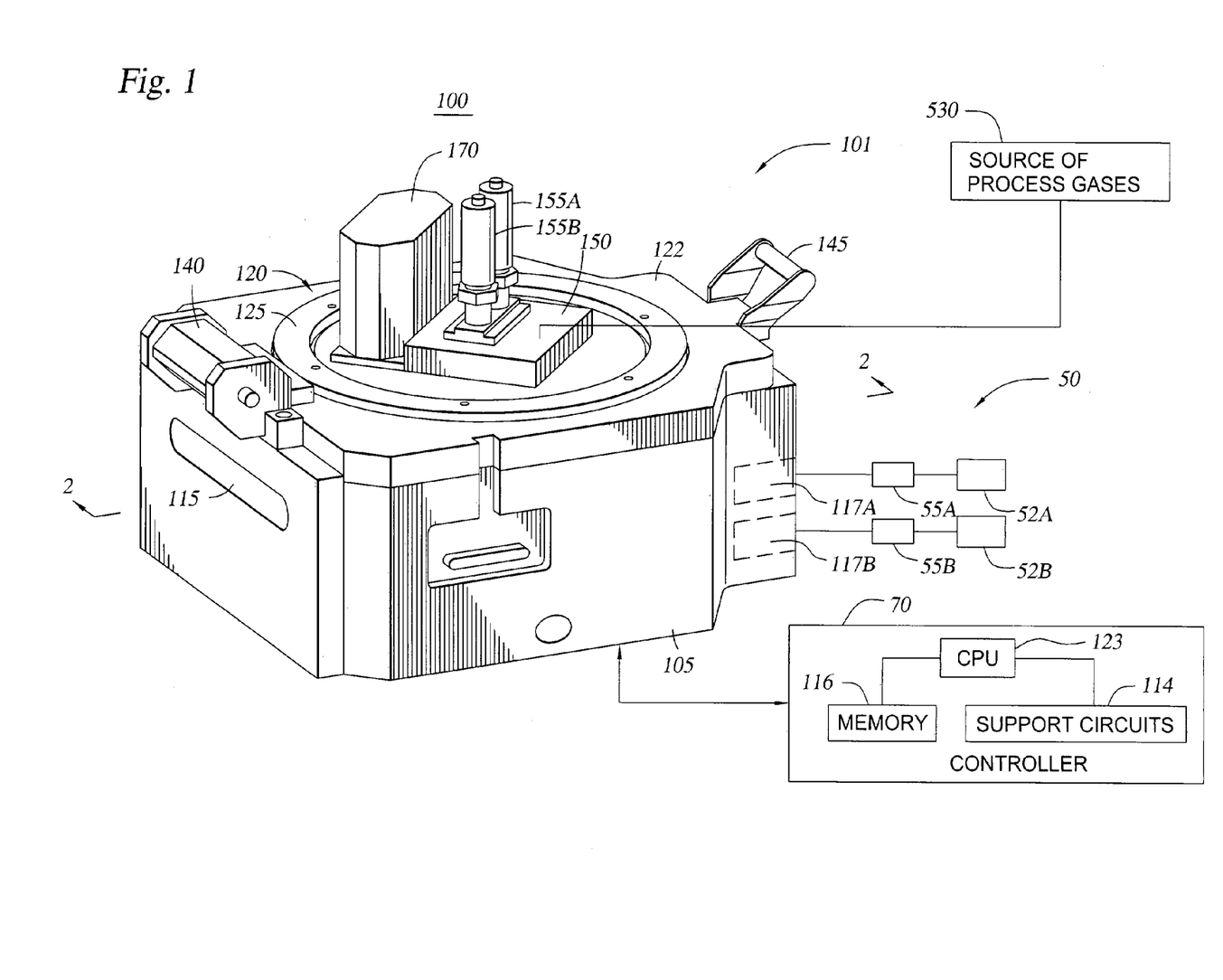
FIG. 1 is a schematic, perspective view of one illustrative embodiment of a semiconductor substrate processing system in accordance with the present invention.

FIG. 1 is a schematic, perspective view of one illustrative embodiment of a processing system 100 comprising a process chamber 101, a controller 70, a dual exhaust system 50, and a source 530 of process gases that are used during a cyclical deposition process (e.g., ALD process).

The process chamber 101 comprises a chamber body 105, a lid assembly 120, and an ozonator 170. In the depicted embodiment, the process chamber 101 has two isolated zones (flow paths) for gaseous compounds that are used during an ALD process. Herein the term "gaseous compound" is collectively used for one or more process gases, such as precursor gases, purge gases, carrier gases, catalytic gases, and the like, as well as for mixtures thereof, and the terms "gas" and "gas mixture" are used interchangeably. The isolated flow paths prevent mixing of gaseous compounds before the compounds reach a reaction region 159 of the process chamber 101. In other embodiments, the process chamber 101 may comprise more than two isolated flow paths.

The lid assembly 120 is disposed on the chamber body 105 and, in a closed position, forms a fluid-tight seal with the chamber body. The lid assembly 120 generally comprises a lid plate 122, a ring heater 125, a manifold block 150, a showerhead 130, and high-speed valves 155A, 155B. Components of the lid assembly 120 are preferably formed from process-compatible materials, such as aluminum, aluminum nitride, stainless steel, graphite, silicon carbide, and the like. The lid assembly 120 further comprises a handle 145 and a hinge assembly 140 used to lift the lid assembly during routine cleaning and maintenance of the process chamber 101.

The chamber body 105 comprises a member 109, a liner 107, and a support pedestal 111. A slit 115 is formed in a sidewall of the chamber body 105 to facilitate transfer of a substrate into and out of the process chamber 101. One example of a suitable wafer transfer robot (e.g., robot 1030 described in reference to FIG. 10) is disclosed in commonly assigned U.S. Pat. No. 4,951,601.

The support pedestal 111, e.g., a ceramic support pedestal, comprises a heater 53A, as well as a thermocouple 50A that is used to monitor the temperature thereof. A signal from the thermocouple 50A may be used in a feedback loop that controls power applied to a heater 53A. The heater 53A may be a resistive heater or other thermal transfer device embedded in or otherwise coupled to the support pedestal 111. Optionally, the support pedestal 111 may be heated using a conduit (not shown) carrying a heat transfer fluid. The support pedestal 111 may also comprise channels (not shown) to deliver a purge gas to an edge and/or backside of the substrate. Further, the substrate support 111 is coupled to a lifting mechanism and comprises a chucking device that holds the substrate thereon (both not shown). Examples of suitable chucking devices include a vacuum chuck, an electrostatic chuck, a clamp ring, and the like. One example of the lifting mechanism is described in the commonly assigned U.S. Pat. No. 5,951,776.

Figure 2:
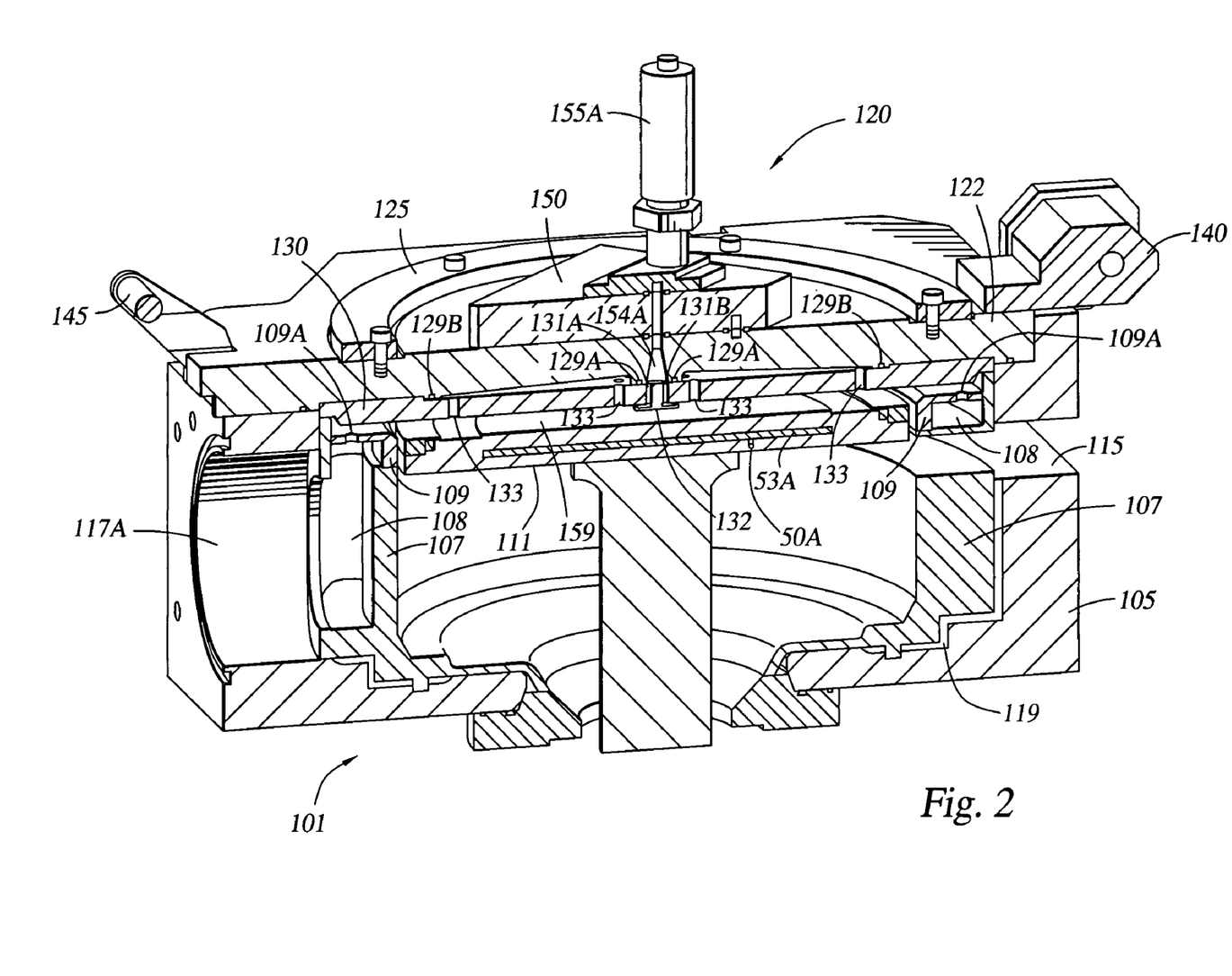
FIG. 2 is a schematic, cross-sectional view of a process chamber of the processing system of FIG. 1.

The liner 107 circumscribes the interior vertical surfaces of the chamber body 105. Alternatively, the liner 107 covers a bottom of the chamber body 105 (as depicted in FIG. 2) or a separate liner may be used to cover the bottom. The liner 107 may be constructed of any process-compatible material. A purge channel 119 is formed between the liner 107 and the chamber body 105. The purge gas is flown through the purge channel 119 to confine the gaseous compounds within the reaction region 159, as well as to minimize unwanted deposition on sidewalls of the chamber and improve heat exchange between the sidewalls and the liner 107.

The member 109 defines gas conductance of a path to the exhaust ports 117A, 117B. In one embodiment, the member 109 is an annular ring having a plurality of apertures 109A. The apertures 109A facilitate uniform removal of gaseous compounds and by-products out of the process chamber 101. A diameter, number, and location of the apertures 109A may be determined based on requirements of a particular ALD process. However, in some embodiments, the member 109 may be omitted and, as such, is considered optional.

The ring heater 125 is attached to the lid plate 120 using, e.g., conventional fasteners, such as screws and the like. Generally, the ring heater 125 comprises at least one embedded electrical heating element (not shown). During the ALD process, the ring heater 125 defines the temperature (e.g., about 90 degrees Celsius or higher) of the lid plate 122 to prevent deposition of gaseous compounds and by-products of the process on the lid plate.

The high-speed valves 155A, 155B (e.g., electronically controlled valves) are mounted on the manifold block 150 such that a fluid-tight seal is provided between the manifold and a valve. The seal may be provided using, e.g., a gasket (not shown) that is placed between the upper surface of the manifold block 150 and bottom surface of a high-speed valve and compressed thereafter. Such gasket may be formed from stainless steel or other compressible and process-compatible material. In one embodiment, the manifold block 150 comprises one or more cooling channels (not shown) disposed therein to protect the high-speed valves 155A, 155B from exposure to excessive operating temperatures during the ALD process. Generally, the manifold block 150 uses running water as a heat transfer medium.

In operation, the high-speed valves 155A, 155B repeatedly deliver, in a predetermined order, pulses of gaseous compounds into the process chamber 101. The on/off periods of the valves are about 100 msec or less. The high-speed valves 155A, 155B are controlled by the controller 70 or, alternatively, by an application specific controller (nor shown), such as, e.g., described in commonly assigned U.S. patent application Ser. No. 09/800,881, filed on Mar. 7, 2001, which is incorporated herein by reference.

In one embodiment, the high-speed valves 155A, 155B are three-port valves. For example, the hiph-speed valve 155A has two intake ports 171A, 177A and one outlet port 173A, and the high-speed valve 155B has two intake ports 171B, 177B and one outlet Dort 173B. In other embodiments, the process chamber 101 may also comprise more than two high-speed valves. However, in other embodiments, a high-speed valve may have only one intake port or more than two intake ports. Suitable high-speed valves are available from Fujikin, Inc. of Japan, and other suppliers.

In one exemplary application, one intake port of the valve is coupled to a source of a precursor gas, while the other intake port is coupled to a source of a purge gas and the outlet port is coupled to a respective outlet channel (channels 154A, 154B). More specifically, one valve (e.g., valve 155A) doses a precursor gas (e.g., aluminum precursor), the other valve (e.g., valve 155B) doses an oxidizing gas (e.g., ozone), and the purge gas can continuously flow through both valves.

Figure 3:
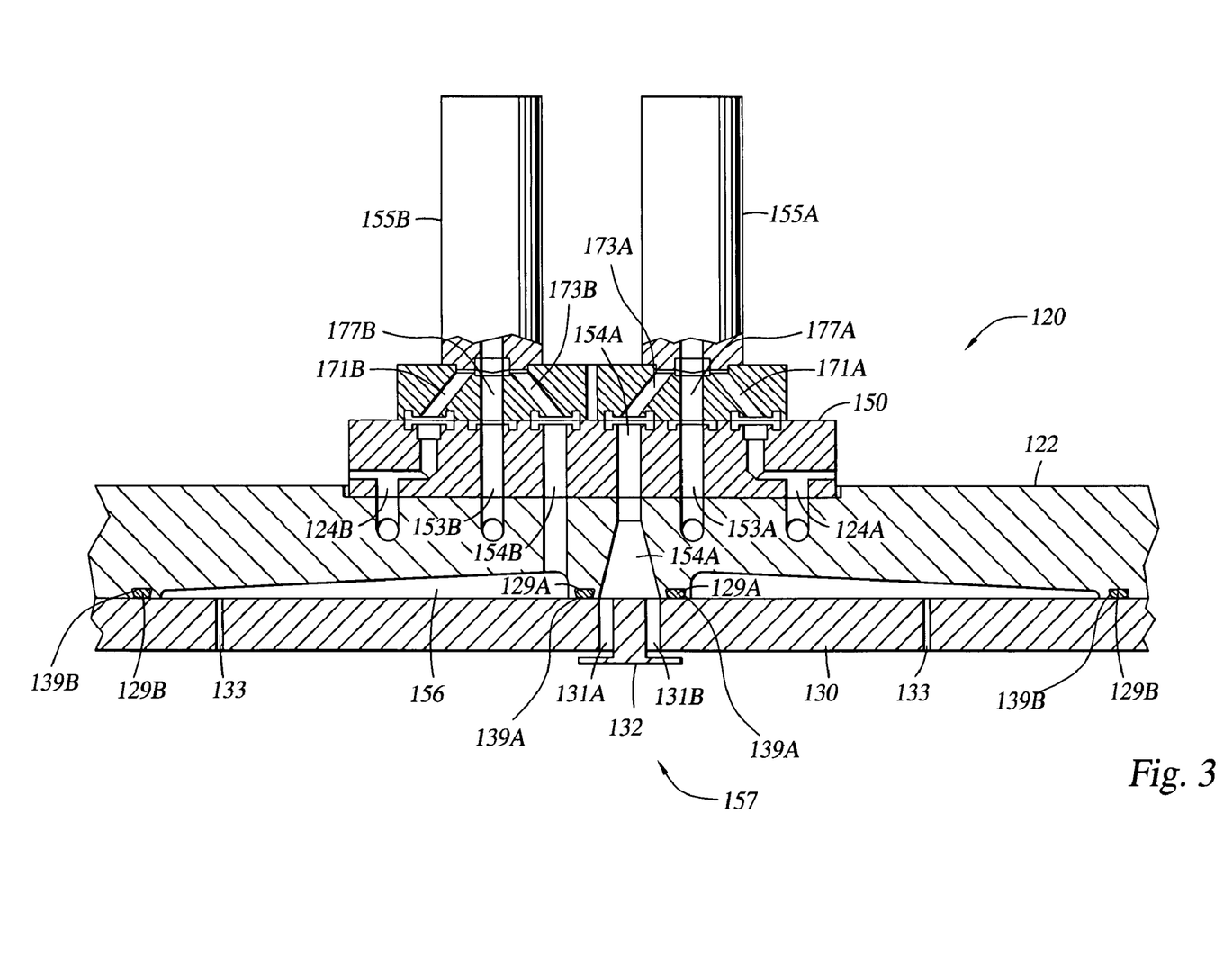
FIG. 3 is a schematic, partial cross-sectional view of a lid assembly of the process chamber of FIG. 2.

FIG. 3 depicts isolated flow paths for individual gaseous compounds. The paths are formed in the lid assembly 120 to separate the compounds within the lid assembly. Generally, each gaseous compound has a dedicated flow path, or, alternatively, the flow path may deliver more than one compound, e.g., one precursor or oxidizing gas and one purge gas. For simplicity of description, embodiments of the invention are further described in terms of a three gaseous compound processing system 100 using e.g., one precursor gas, one oxidizing gas, and one purge gas. Such processing system comprises at least two isolated flow paths. However, in other embodiments, the processing system 100 may comprise a different number of isolated flow paths and/or use a different number of gaseous compounds.

The first flow path comprises an inlet channel 153A for a fist gaseous compound (e.g., aluminum precursor, such as at least one of trimethylaluminum (Al(CH3)3), triisopropoxy-aluminum (Al(C3H7)3), and dimethylaluminumhydride (Al(CH3)2H), as well as precursors having a chemical structure Al(R1)(R2)(R3), where R1, R2, R3 may be the same or different ligands, and the like), an inlet channel 124A for a purge gas (e.g., helium (He), argon (Ar), nitrogen (N2), hydrogen (H2), and the like), the high-speed valve 155A, and an outlet channel 154A. Similarly, the second flow path comprises an inlet channel 153B for a second gaseous compound (e.g., oxidizing gas, such as, e.g., ozone (O3), oxygen (O2), water (H2O) vapor, nitrous oxide (N2O), nitric oxide (NO), and the like), an inlet channel 124B for the purge gas, the high-speed valve 155B, and an outlet channel 154B. The inlet channels 153A, 153B are generally each coupled at a first end thereof to a source (not shown) of an individual gaseous compound, as well as coupled at a second end thereof to the respective valve 155A, 155B. The inlet channels 124A, 124B similarly transfer one or more purge gases to the valves 155A, 155B. In one embodiment, a diameter of the gas channel 154A increases towards the showerhead 130 to decrease the kinetic energy of the flowing gaseous compound.

In operation, in the depicted embodiment, the first gaseous compound is dosed (pulsed) using the high-speed valve 155A and then directed to the reaction region 159 through the outlet channel 154A (in the manifold block 150 and lid plate 122) and centrally located slotted openings 131A, 131B (discussed in reference to FIG. 4) in the showerhead 130. Similarly, the second gaseous compound is pulsed using the high-speed valve 155B and then directed to the reaction region 159 through the outlet channel 154B (in the manifold block 150 and lid plate 122), a sealed cavity 156, and a plurality of apertures 133 in the showerhead 130. As such, the first and second gaseous compounds are separated from one another within the lid assembly 120. The cavity 156 can be sealed using, e.g., O-ring seals 139A, 139B that are disposed in the channels 129A, 129B, respectively.

A dispersion plate 132 is disposed near the slotted openings 131A, 131B and deflects, both horizontally and vertically, a flow of the gaseous compound from the slotted openings 131A, 131B. The plate converts a substantially vertical flow of the compound into the partially horizontal flow and prevents the gaseous compound from impinging directly on the substrate. The dispersion plate 132 may be a part of the showerhead 130 or, alternatively, may be affixed to the showerhead. The dispersion plate 132 re-directs and decreases velocity of the gaseous compound. Without such re-direction, the impinging compound may sweep away (sputter) reactive molecules already disposed on the substrate. Further, the dispersion plate 132 prevents excess deposition onto regions of the substrate that oppose the openings 131 A, 131 B and, as such, facilitates uniform depositing of the film on the substrate.

Figure 4:
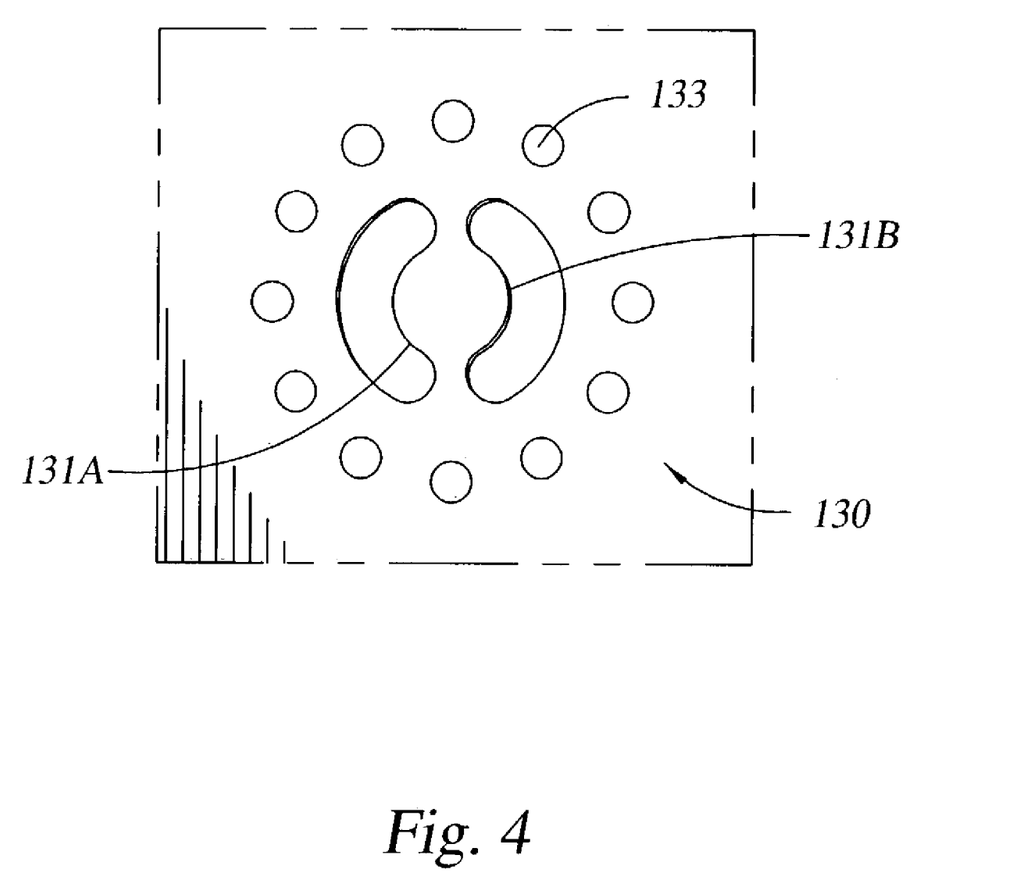
FIG. 4 is a schematic, partial view of a showerhead of the process chamber of FIG. 2.

FIG. 4 is a schematic, partial view of a portion of the showerhead 130 taken along an arrow 157 in FIG. 3. In one embodiment, the showerhead 130 comprises a plurality of apertures 133 disposed around the slotted openings 131A, 131B. In a further embodiment, the apertures 133 comprise nozzles 130A (FIG. 5) to provide a directional delivery of a gaseous compound to the substrate below. In one embodiment, the nozzles 130A are angled relative to the upper surface of the support pedestal 111. The apertures 133 and nozzles 130A are sized and positioned to provide uniform distribution of the gaseous compound across the substrate. In one embodiment, the apertures 133 are formed on the entire surface of the showerhead 130. In an alternative embodiment, the apertures 133 are formed substantially within a region opposing the support pedestal 111. Although the openings 131A, 131B are shown having a generally circular form factor, the openings may have any other form factor that provides a desired pattern of a flow of a gaseous compound in the reaction region 159. Further, in other embodiments, a number of the centrally located openings in the showerhead 130 may be either one or greater than two.

The dual exhaust system 50 comprises an exhaust channel 108 formed in the liner 107, exhaust ports 117A, 117B) formed in a sidewall of the process chamber 101, exhaust pumps 52A, 52B, and valves 55A, 55B (e.g., electronic, pneumatic or ball valves and the like). In one embodiment, operation of the valves 55A, 55B is synchronized with operation of the high-speed valves 155A, 155B, e.g., the valves 55A, 55B open and close contemporaneously with such actions of the high-speed valves. During the ALD process, each exhaust pump can be operated independently, and, preferably, is used to remove specific gaseous compounds. In one illustrative embodiment, one pump is used to remove an aluminum precursor and the other pump is used to remove an oxidizing gas, while both pumps are used simultaneously to remove the purge gas.

In this embodiment, a gaseous compound dosed into the chamber body 150 using the high-speed valve 155A is exhausted from the process chamber 101 through the exhaust valve 55A that is open when the exhaust valve 55B is closed. Similarly, the gaseous compound dosed into the process chamber 101 using the high-speed valve 155B is exhausted from the chamber through the exhaust valve 55B that is open when the exhaust valve 55A is closed. As such, the dual exhaust system 50 reduces mixing of gaseous compounds in the processing system 100. Consequently, half reactions occur without chemical combination that results in chemical vapor deposition (CVD). By avoiding CVD, the chamber components and exhaust conduits remain substantially free of deposited contaminants.

In a further embodiment, an off-cycle valve (i.e., temporarily closed valve) is not opened to the exhaust port immediately upon initiation of a pulse of a gaseous compound, but instead lags the pulse by a small time delay to reduce cross-contamination of the gaseous compounds within the dual exhaust system 50. Likewise, once both exhaust valves are open during the purge step, the exhaust valve not associated with the subsequent pulse of the other gaseous compound is closed just prior to initiation of the pulse of the compound. Such synchronized operation of the dual exhaust system 50 is generally performed by a computer controller 70 or, alternatively, by the application specific controller.

The dual exhaust system 50 may further comprise a trap (not shown) disposed between the exhaust pump and exhaust valve or between the chamber body 105 and exhaust valve. The trap removes by-products of the ALD process from an exhaust stream thereby increasing performance and service intervals of the exhaust pump. The trap may be of any conventional type suited to collection of by-products generated during the ALD process.

Although the dual exhaust system is described, in an alternative embodiment, a single exhaust system may also be used. Such exhaust system may utilize, e.g., the pump 52A (or 52B), the optional trap, and the exhaust valve 55A (or 55B) coupled to the exhaust port 117A (or 117B). In this embodiment, during an ALD process, the exhaust pump is on and the exhaust valve is open.

The ozonator 170 (i.e., source of ozone) is in fluid communication with a source of the precursor (e.g., oxygen), as well as with inlet channels 124A, 124B in the manifold block 150. Preferably, the ozonator 170 is disposed in close proximity to the processing system 100 (as shown in FIG. 1), such that losses associated with delivery of ozone into the process chamber 101 are minimized. Ozonators are available, e.g., from ASTeX® Products of Wilmington, Mass.

In another embodiment, the oxidizing gas may be produced using, e.g., a remote source (not shown), such as a remote plasma generator (e.g., DC, radio frequency (RF), microwave (MW) plasma generator, and the like). The remote source produces reactive species, which then are delivered to the process chamber 101. Such remote sources are available from Advanced Energy Industries, Inc. of Fort Collins, Colo. and others. Alternatively, the oxidizing gas can be produced using a thermal gas break-down technique, a high-intensity light source (e.g., UV or x-ray source), and the like.

Figure 5:
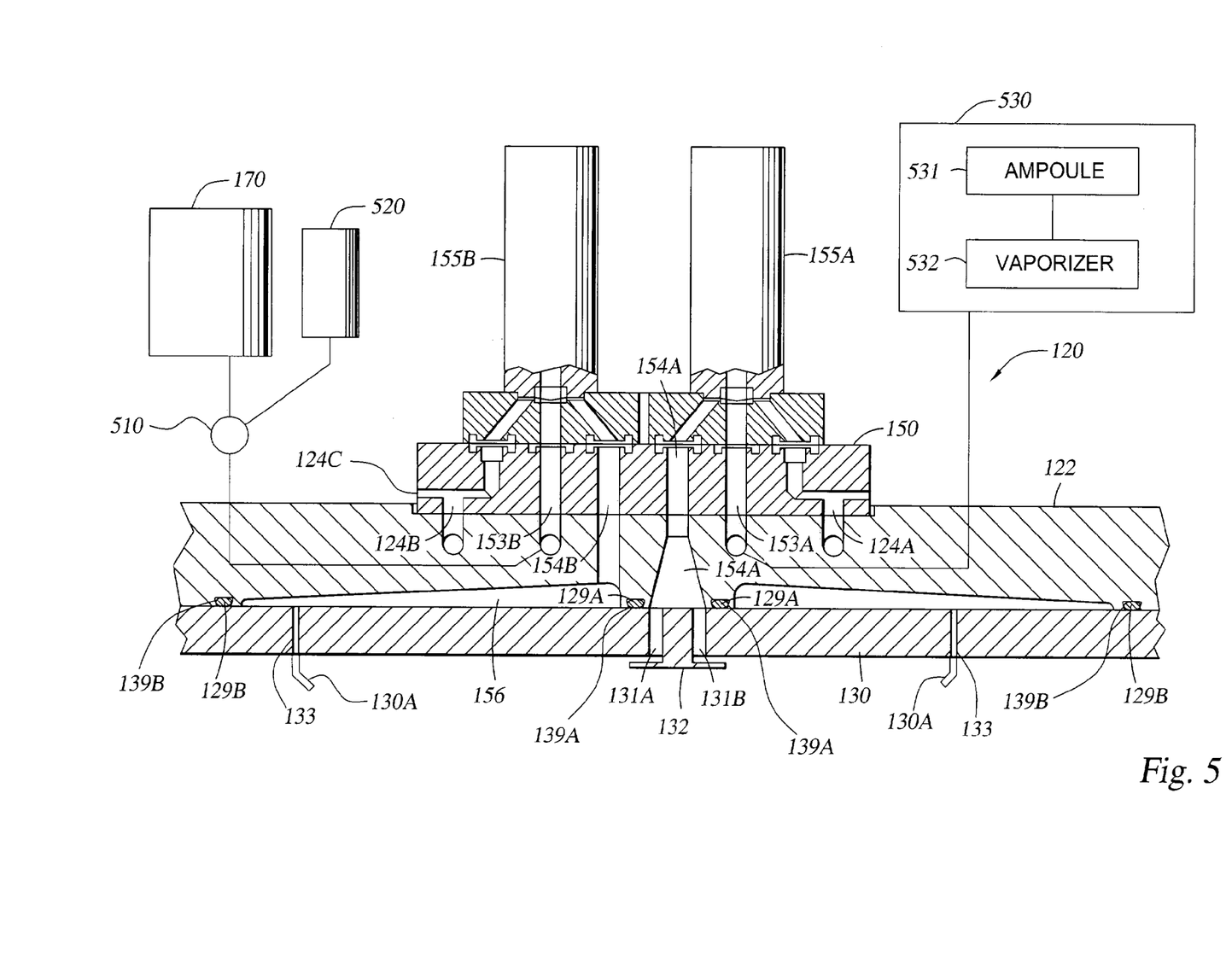
FIG. 5 is a schematic, partial cross-sectional view of another embodiment of the lid assembly of the process chamber of FIG. 2.

FIG. 5 is a schematic, partial cross-sectional view of an alternative embodiment of the lid assembly 120 comprising the ozonator 170 coupled to the process chamber 101 and to a buffer cavity 520, through a diverter valve 510. Generally, the diverter valve 510 couples the ozonator 170 to the process chamber 101 contemporaneously with an open state (with respect to the inlets 124A, 124B) of the high-speed valves 155A, 155B. Accordingly, the diverter valve 510 couples the ozonator 170 to the buffer cavity 520 when the high-speed valves 155A, 155B are in a closed state in respect to the inlets 124A, 124B. The buffer cavity 520 simulates a second process chamber and, as such, using the diverter valve 510, ozone and/or other oxidizing gas can be produced continuously during the ALD process.

In one embodiment, the source 530 comprises an ampoule 531 containing a liquid aluminum precursor and a vaporizer 532. The ampoule 531, the vaporizer 532, and delivering lines may each be heated (e.g., using any conventional method of heating) to assist in vaporization of the liquid phase, as well as in preventing the vaporized precursor from condensing. Alternatively, the precursor may be pre-mixed with a solvent that reduces viscosity of the liquid phase, and then vaporized. A carrier gas, such as argon, helium (He), hydrogen (H2), and the like may also be used to facilitate delivery of the precursor, in a form of a gaseous compound, to the process chamber 101.

Figure 6:
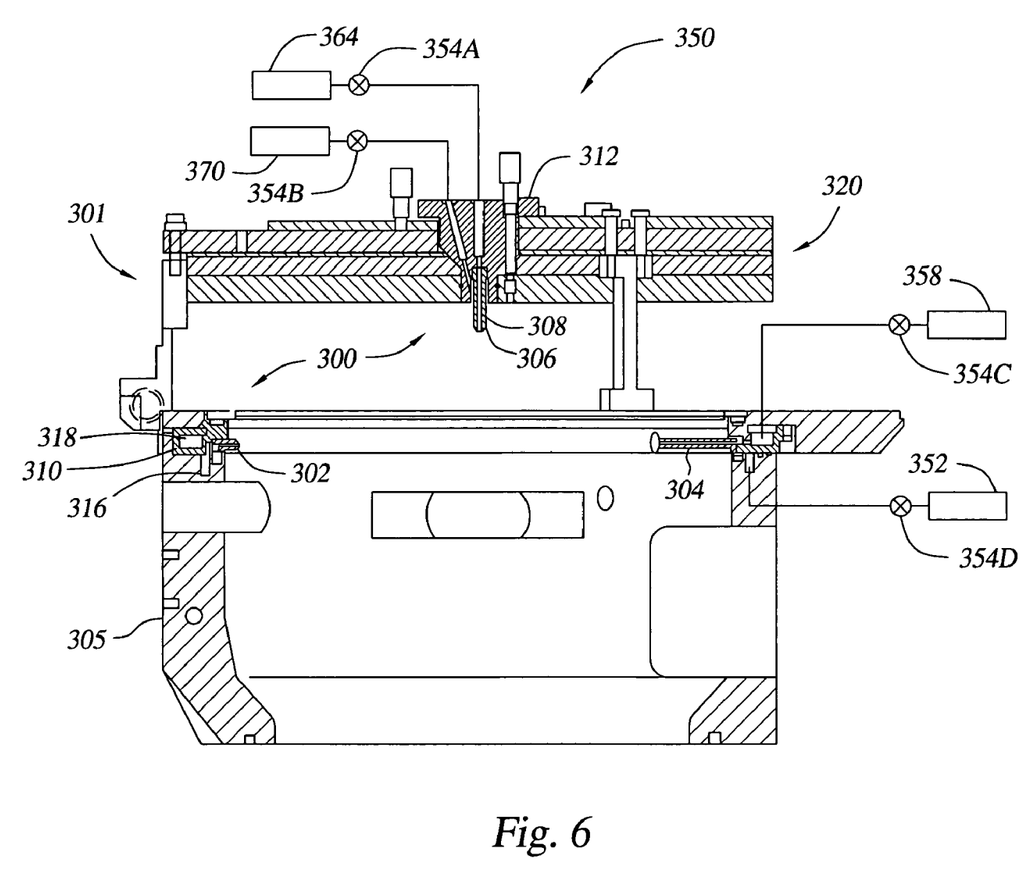
FIG. 6 is a schematic, partial cross-sectional view of another embodiment of the process chamber of the processing system FIG. 1.

FIG. 6 is a schematic, partial cross-sectional view of another embodiment an ALD process chamber 301 comprising a circumferential gas delivery assembly 300 and an upper gas delivery assembly 350.

The circumferential gas delivery assembly 300 is disposed in a chamber body 305 and comprises an annular gas ring 310 having at least two separate gas distribution channels 316, 318 to supply at least two separate gaseous compounds into the process chamber 301. Each gas distribution channel is coupled to a source of a gaseous compound and comprises a plurality of ports adapted for receiving gas nozzles. As such, each gas distribution channel is in fluid communication with a plurality of circumferentially mounted gas nozzles. In one embodiment, alternating ports are connected to one of the gas distribution channels, while the other ports are connected to the other channel. In the depicted embodiment, a gaseous compound from the source 352 is distributed through the nozzles 302 of the gas distribution channel 316. Similarly, a gaseous compound from the source 358 is distributed through the nozzles 304 of the gas distribution channel 318.

The upper gas delivery assembly 350 is disposed in the lid assembly 320 and comprises a center gas feed 312 and a nozzle 306. Generally, the center gas feed 312 is in fluid communication with two or more sources 364, 370 of other gaseous compounds.

Such embodiment provides, through the peripheral gas nozzles 302, 304 and the central gas nozzle 306, three separate passes for the gaseous compounds (e.g., metal-containing precursor, oxidizing gas, and inert gas) in the process chamber 301. Further, different gaseous compounds can be introduced into a reaction volume at select locations within the chamber. In the depicted embodiment, the gaseous compounds are dosed using four high-speed valves 354A–354D each having one intake port and one outlet port. In other embodiments, during a cyclical deposition process, at least one of the gaseous compounds may be flown into the process chamber 301 continuously. In further embodiments, the gas delivery assembly 300 may comprise more than one annular gas ring 310 or the ring may have more than two gas distribution channels, as well as the upper gas delivery assembly 350 may comprise more than one gas nozzle 306.

Generally, the gas distribution ring 310 and the nozzles 302, 304, and 306 are made of a process-compatible material (e.g., aluminum, stainless steel, and the like), as well as are supplied with conventional process-compatible fluid-tight seals (not shown), such as o-rings and the like. The seals isolate the gas distribution channels 316, 318 from one another. In one embodiment, the nozzles 302, 304, and 306 are threaded in -the respective ports to provide fluid-tight couplings therein, as well as means facilitating prompt replacement of the nozzles. A form factor of the restricting orifice of a nozzle can be selected for desired dispersion of gaseous compound within the chamber.

Figure 7:
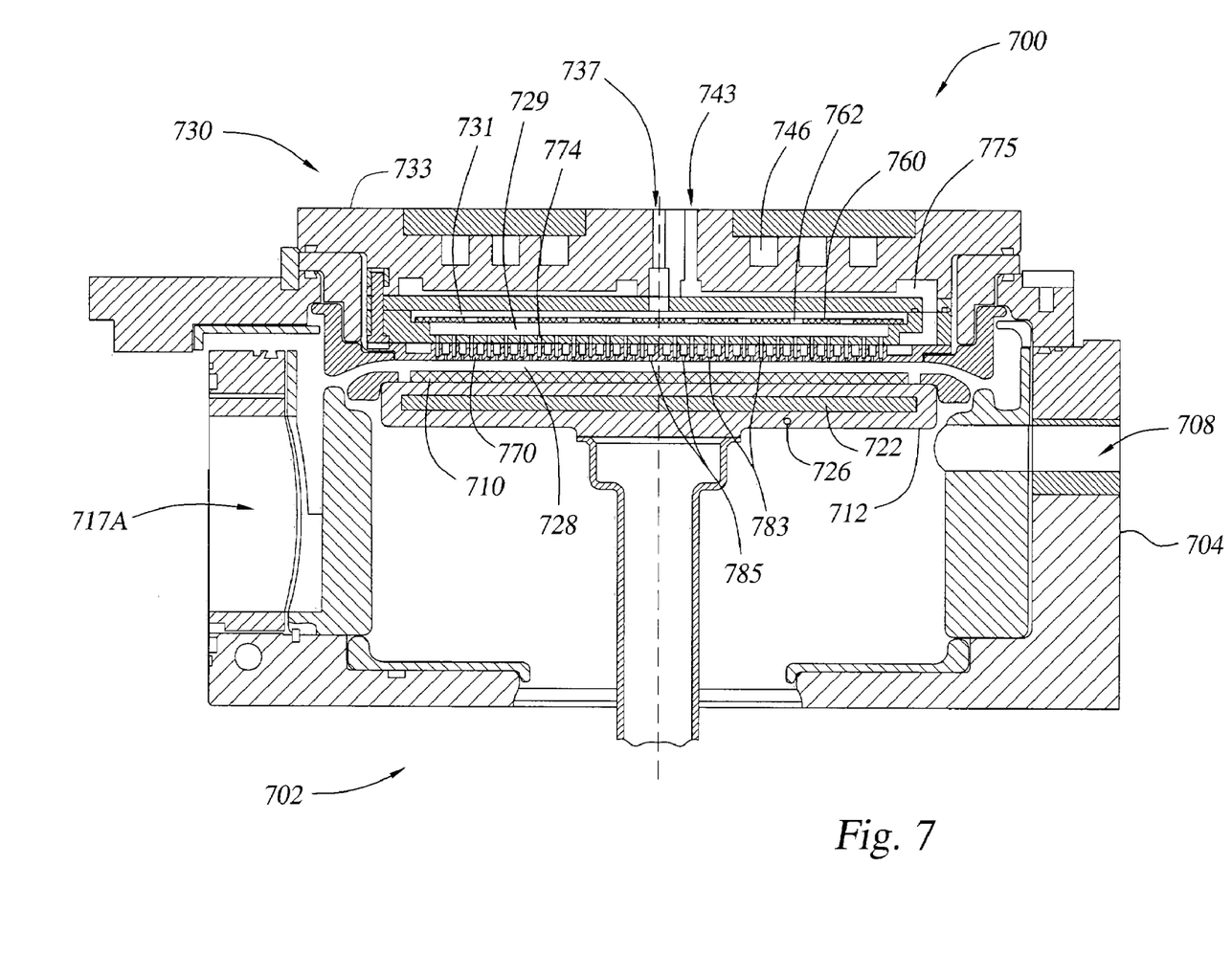
FIG. 7 is a schematic, partial cross-sectional view of yet another illustrative embodiment of the process chamber of the processing system FIG. 1.

FIG. 7 is a schematic, cross-sectional view of still another embodiment of a process chamber 700 for performing the cyclical deposition processes. The process chamber 700 comprises a chamber body 702 and gas distribution system 730.

The chamber body 702 houses a substrate support 712 that supports a substrate 710 in the chamber 700. The substrate support 712 comprises an embedded heater element 722. A temperature sensor 726 (e.g., a thermocouple) is embedded in the substrate support 712 to monitor the temperature of the substrate support 712. Alternatively, the substrate 710 may be heated using a source of radiant heat (not shown), such as quartz lamps and the like. Further, the chamber body 702 comprises an opening 708 in a sidewall 704 providing access for a robot to deliver and retrieve the substrate 710, as well as exhaust ports 717A, 717 B (only port 717A is shown) that are fluidly coupled to the dual exhaust system 50 (discussed in reference to FIG. 1 above).

The gas distribution system 730 generally comprises a mounting plate 733, a showerhead 770, and a blocker plate 760 and provides at least two separate paths for gaseous compounds into a reaction region 728 between the showerhead 770 and the substrate support 712. In the depicted embodiment, the gas distribution system 730 also serves as a lid of the process chamber 700. However, in other embodiments, the gas distribution system 730 may be a portion of a lid assembly of the chamber 700. The mounting plate 733 comprises a channel 737 and a channel 743, as well as a plurality of channels 746 that are formed to control the temperature of the gaseous compounds (e.g., by providing either a cooling or heating fluid into the channels). Such control is used to prevent decomposing or condensation of the compounds. Each of the channels 737, 743 provides a separate path for a gaseous compound within the gas distribution system 730.

Figure 8:
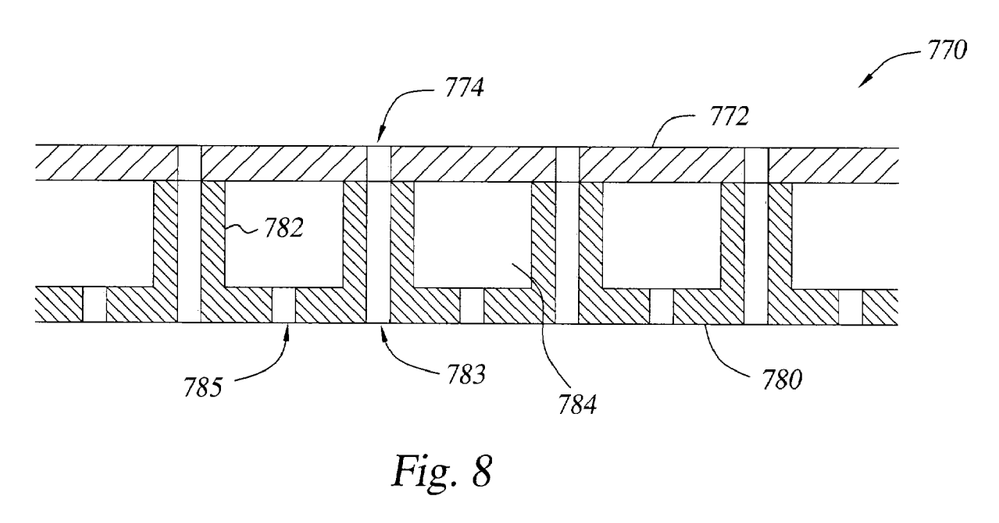
FIG. 8 is a schematic, partial cross-sectional view of one embodiment of a showerhead of the process chamber of FIG. 7.
Figure 9:
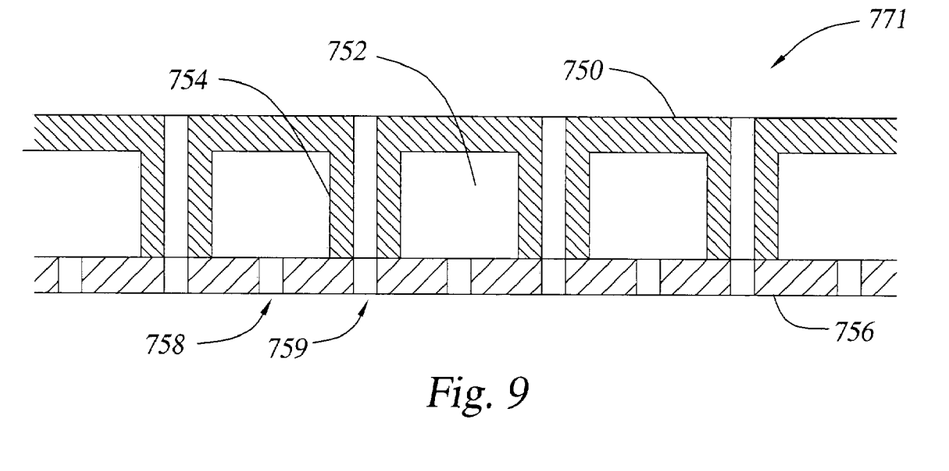
FIG. 9 is a schematic, partial cross-sectional view of another embodiment of the showerhead of the process chamber of FIG. 7.

FIG. 8 is a schematic, partial cross-sectional view of one embodiment of the showerhead 770. The showerhead 770 comprises a plate 772 that is coupled to a base 780. The plate 772 has a plurality of openings 774, while the base 780 comprises a plurality of columns 782 and a plurality of grooves 784. The columns 782 and grooves 784 comprise openings 783 and 785, respectively. The plate 772 and base 780 are coupled such, that the openings 783 in the base align with the openings 774 in the plate to form a path for a first gaseous compound through the showerhead 770. The grooves 784 are in fluid communication with one another and, together, facilitate a separate path for a second gaseous compound into the reaction region 728 through the openings 785. In an alternative embodiment (FIG. 9), the showerhead 771 comprises the plate 750 having the grooves 752 and columns 754, and a base 756 comprising a plurality of openings 758 and 759. In either embodiment, contacting surfaces of the plate and base may be brazed together to prevent mixing of the gaseous compounds within the showerhead.

Each of the channels 737 and 743 is coupled to a source (not shown) of the respective gaseous compound. Further, the channel 737 directs the first gaseous compound into a volume 731, while the channel 743 is coupled to a plenum 775 that provides a path for the second gaseous compound to the grooves 784. The blocker plate 760 comprises a plurality of openings 762 that facilitate fluid communication between the volume 731, plenum 729, and a plurality of openings 774 that disperse the first gaseous compound into the reaction region 728. As such, the gas distribution system 730 provides separate paths for the gaseous compounds delivered to the channels 737 and 743.

In one embodiment, the blocker plate 760 and the showerhead 770 are electrically isolated from one another, the mounting plate 733, and chamber body 702 using insulators (not shown) formed of, e.g., quartz, ceramic, and like. The insulators are generally disposed between the contacting surfaces in annular peripheral regions thereof to facilitate electrical biasing of these components and, as such, enable plasma enhanced cyclical deposition techniques, e.g., plasma enhanced ALD (PEALD) processing.

In one exemplary embodiment, a power source may be coupled, e.g., through a matching network (both not shown), to the blocker plate 760 when the showerhead 770 and chamber body 702 are coupled to a ground terminal. The power source may be either a radio-frequency (RF) or direct current (DC) power source that energizes the gaseous compound in the plenum 729 to form a plasma. Alternatively, the power source may be coupled to the showerhead 770 when the substrate support 712 and chamber body 702 are coupled to the ground terminal. In this embodiment, the gaseous compounds may be energized to form a plasma in the reaction region 728. As such, the plasma may be selectively formed either between the blocker plate 760 and showerhead 770, or between the showerhead 770 and substrate support 712. Such electrical biasing schemes are disclosed in commonly assigned U.S. patent application Ser. No. 10/354,214, filed Jan. 27, 2003, which is incorporated herein by reference.

In still another embodiment, the blocker plate 760 and showerhead 770 may be coupled to separate outputs of the matching network to produce an electrical field gradient to direct the plasma species through the openings in the showerhead 770 towards the substrate 710. In yet another alternative embodiment, to produce the electrical field gradient, the blocker plate 760 and showerhead 770 may be individually coupled to separate power sources each using a separate matching network.

Referring to FIG. 1, the controller 70 comprises a central processing unit (CPU) 123, a memory 116, and a support circuit 114. The CPU 123 may be of any form of a general-purpose computer processor that is used in an industrial setting. The software routines can be stored in the memory 116, such as random access memory, read only memory, floppy or hard disk drive, or other form of digital storage. The support circuit 114 is coupled to the CPU 123 in a conventional manner and may comprise cache, clock circuits, input/output sub-systems, power supplies, and the like. The software routines, when executed by the CPU 123, transform the CPU into a specific purpose computer (controller) 70 that controls the reactor 100 such that the processes are performed in accordance with the present invention. The software routines may also be stored and/or executed by a second controller (not shown) that is located remotely from the reactor 100.

Figure 10:
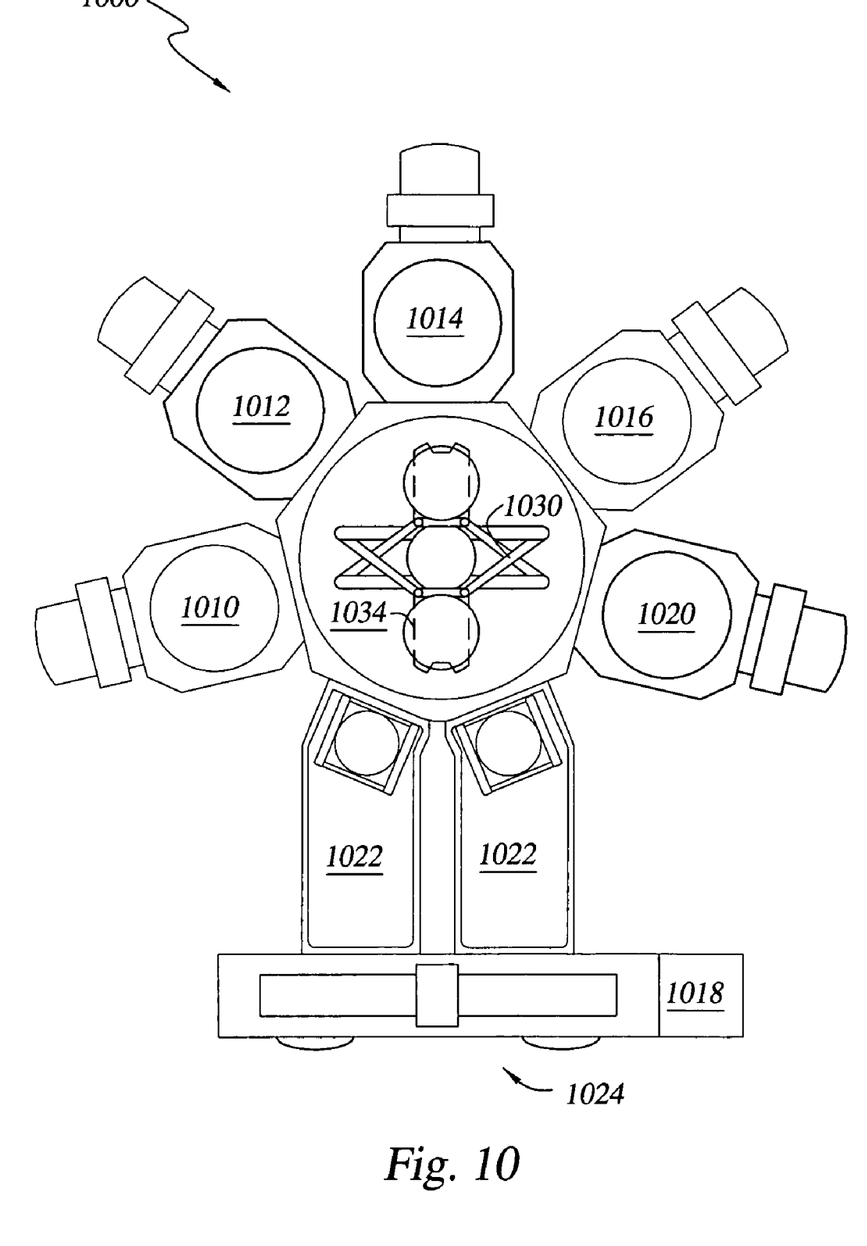
FIG. 10 is a schematic, plan view of a processing platform integrating the process chambers used in performing cyclical deposition processes of the present invention.

FIG. 10 is a schematic, top plan view of an exemplary integrated processing system 1000 configured to form a film stack having an aluminum oxide layer. One such integrated processing system is a Centura® system that is available from Applied Materials, Inc. of Santa Clara, Calif. The particular embodiment of the system 1000 is provided to illustrate the invention and should not be used to limit the scope of the invention.

The system 1000 generally includes load lock chambers 1022 that protect vaccumed interior of the system 1000 from contaminants. A robot 1030 having a blade 1034 is used to transfer the substrates between the load lock chambers 1022 and process chambers 1010, 1012, 1014, 1016, 1020. One or more of the chambers is an aluminum oxide chamber, such as the process chambers described above in reference to FIGS. 1–9. Further, one or more chambers may be adapted to deposit a material used during fabrication of integrated circuits, as well as be a cleaning chamber (e.g., a plasma cleaning chamber) used to remove unwanted products from a substrate. Example of such cleaning chamber is the Preclean ™ II chamber available from Applied Materials, Inc. of Santa Clara, Calif. Optionally, one or more of the chambers 1010, 1012, 1014, 1016, 1020 may be an annealing chamber or other thermal processing chamber, e.g., the Radiance™ chamber available from Applied Materials, Inc. of Santa Clara, Calif. Further, the system 1000 may comprise one or more metrology chambers 1018 connected thereto using, e.g., a factory interface 1024. Alternatively, the system 1000 may comprise other types of process chambers.

One example of a possible configuration of the integrated processing system 1000 includes a load lock chamber (chamber 1022), an aluminum oxide cyclical deposition chamber (chamber 1010), a first dielectric deposition chamber (chamber 1012), a metal deposition chamber (chamber 1014), a second dielectric deposition chamber (chamber 1016), and an annealing chamber (chamber 1020).

The processing system 1000 may be used to deposit, with low film contamination and minimal gas phase reactions between the precursors, various metal-containing films, e.g., aluminum oxide, copper, titanium, tantalum, tungsten films, and the like. In one illustrative application, the processing system 1000 is used to deposit an aluminum oxide film. Various cyclical deposition processes used to deposit the aluminum oxide and other films using the processing system 1000 are described in commonly assigned U.S. provisional patent application Ser. No. 60/357,382, filed Feb. 15, 2002, which is incorporated herein by reference.

Although the forgoing discussion referred to the apparatus for performing cyclical deposition processes, other processing apparatuses can benefit from the invention. The invention can be practiced in other semiconductor processing systems wherein the parameters may be adjusted to achieve acceptable characteristics by those skilled in the art by utilizing the teachings disclosed herein without departing from the spirit of the invention.

While foregoing is directed to the illustrative embodiment of the present invention, other and further embodiments of the invention may be devised without departing from the basic scope thereof, and the scope thereof is determined by the claims that follow.

What is claimed is:

1. An apparatus for cyclical deposition of thin films on a semiconductor substrate, comprising:
a process chamber, comprising:
a body defining a reaction region; and
a lid assembly, comprising a gas distribution system having a first path and a second path to separate and dose at least one process gas to the reaction region, said first and second paths extending from an intake port for each process gas, to an outlet channel, and to the reaction region of the chamber, wherein a first set of valves dosing the process gases are between the intake port and the outlet channel, the first and second paths formed in the lid assembly and a showerhead, the showerhead comprising:
a plurality of openings fluidly coupled to the second path and the reaction region; and
a valved exhaust system synchronized with the first set of valves dosing the process gases into the reaction region to separate exhausted gases, wherein at least one of the plurality of openings further comprises a gas nozzle coupled to the at least one opening.

2. An apparatus for cyclical deposition of thin films on a semiconductor substrate, comprising:
a process chamber, comprising:
a body defining a reaction region; and
a lid assembly, comprising a gas distribution system having a first path and a second path to separate and dose at least one process gas to the reaction region, said first and second paths extending from an intake port for each process gas, to an outlet channel, and to the reaction region of the chamber, wherein a first set of valves dosing the process gases are between the intake port and the outlet channel, the first and second paths formed in the lid assembly and a showerhead, the showerhead comprising:
a plurality of openings fluidly coupled to the second path and the reaction region; and
a valved exhaust system synchronized with the first set of valves dosing the process gases into the reaction region to separate exhausted gases, wherein said paths are at least two different circumferential channels formed around a substrate support in the body of the process chamber and coupled to a plurality of gas nozzles for dispersing a gas into the reaction region.

3. The apparatus of claim 2 wherein the gas nozzles coupled to different circumferential channels are disposed in an alternating order.

4. An apparatus for cyclical deposition of thin films on a semiconductor substrate, comprising:
a plasma process chamber, comprising;
a body; and
a lid assembly, comprising a gas distribution system having a first path and a second path to separate and dose at least one process gas, said first and second paths extending from an intake port for the process gases, to an outlet channel, and to a reaction region of the chamber, the outlet channel having a diameter that increases towards the reaction region, wherein a first set of valves are between the intake port and the outlet channel; and
a valved exhaust system synchronized with the first set of valves dosing the process gases into the reaction region to separate exhausted gases.

5. The apparatus of claim 4, wherein the process chamber further comprises an exhaust channel fluidly coupled to the reaction region.

6. The apparatus of claim 5, wherein the exhaust channel comprises at least one outlet port, each said outlet port being fluidly coupled to an intake port of the exhaust system.

7. The apparatus of claim 4, wherein the exhaust system comprises at least one intake port, each said intake port being fluidly coupled to at least one controlled exhaust shut-off valve.

8. The apparatus of claim 7, wherein the at least one controlled exhaust shut-off valve is fluidly coupled to an exhaust pump.

9. The apparatus of claim 7, wherein the at least one controlled exhaust shut-off valve is open during dosing of the at least one process gas and is closed during dosing of the at least one other process gas.

10. The apparatus of claim 7, wherein the at least one controlled exhaust shut-off valve opens and closes with a delay corresponding to a travel time for the process gas in the path from the intake port for the gas to the exhaust system.

11. The apparatus of claim 4, wherein the exhaust system further comprises at least one trap for by-products of processing performed in the process chamber, said traps are disposed upstream of the at least one exhaust pump.

* * * * *

UNITED STATES PATENT AND TRADEMARK OFFICE
CERTIFICATE OF CORRECTION

PATENT NO. : 7,175,713 B2  
APPLICATION NO. : 10/352257  
DATED : February 13, 2007  
INVENTOR(S) : Thakur et al.

Page 1 of 1

It is certified that error appears in the above-identified patent and that said Letters Patent is hereby corrected as shown below:

Column 4, Line 25: Change "nor" to --not--

Column 4, Line 33: Change "Dort" to --port--

Column 4, Line 64: Change "(Al(CH3)3)" to --(Al(CH$_3$)$_3$)--

Column 4, Line 65: Change "(Al(C3H7)3)" to --(Al(C$_3$H$_7$)$_3$)--

Column 5, Line 2: Change "(N2)" to --N$_2$--

Column 5, Line 3: Change "(H2)" to --H$_2$--

Column 5, Line 6: Change "(O3)" to --O$_3$--

Column 5, Line 7: Change "(O2)" to --O$_2$--

Column 5, Line 7: Change "(H2O)" to --H$_2$O--

Column 5, Line 7: Change "(N2O)" to --N$_2$O--

Column 5, Line 48: Change "131 A, 131 B" to --131A, 131B--

Column 6, Line 5: Change "117B)" to --117B--

Column 7, Line 38: Change "(H2)" to --H$_2$--

Column 8, Line 24: Change "-the" to --the--

Column 10, Line 63: Change "forgoing" to --foregoing--

Signed and Sealed this

Twenty-second Day of May, 2007

JON W. DUDAS  
*Director of the United States Patent and Trademark Office*